United States Patent [19]
Yung

[11] Patent Number: 5,166,687
[45] Date of Patent: Nov. 24, 1992

[54] APPARATUS AND METHOD FOR ENHANCING CAPACITANCE MATCHING IN A MULTI-STAGE WEIGHTED CAPACITOR A/D CONVERTER WITH CONDUCTIVE SHIELDS

[75] Inventor: Henry T. Yung, Richardson, Tex.

[73] Assignee: Texas Instruments Incorporated, Dallas, Tex.

[21] Appl. No.: 716,434

[22] Filed: Jun. 17, 1991

[51] Int. Cl.$^5$ .................. H03M 1/06; H03M 1/42
[52] U.S. Cl. ............................ 341/172; 341/118
[58] Field of Search .......... 341/172, 150, 155, 144, 341/118, 126

[56] References Cited

U.S. PATENT DOCUMENTS 4,799,042 1/1989 Confalonieri et al. .......... 341/172 X

OTHER PUBLICATIONS

J. L. McCreary, et al., "All-MOS Charge Redistribution Analog-to-Digital Conversion Techniques-Part I" *IEEE Journal of Solid State Circuits*, vol SC-10, No. 6, Dec. 1975, pp. 371-379.
Y. S. Yee, et al., "A Two-Stage Weighted Capacitor Network for D/A-A/D Conversion", *IEEE Journal of Solid State Circuits*, vol. SC-14, No. 4, Aug. 1979, pp. 778-781.
R. K. Hester et al., "Fully Differential ADC With Rail-to-Rail Common-Mode Range and Nonlinear Capacitor Compensation" *IEEE Journal of Solid-State Circuits*, vol. 25, No. 1, Feb. 1990, pp. 173-182.

*Primary Examiner*—Sharon D. Logan
*Attorney, Agent, or Firm*—W. James Brady, III; B. Peter Barndt; Richard L. Donaldson

[57] ABSTRACT

Apparatus for enhancing capacitance matching in a multi-stage capacitor network of an A/D converter is provided. The stages are coupled to one another by a coupling capacitor having a top and bottom plate. The apparatus comprises a first shield overlying the capacitor network, where the shield is coupled to a known potential. A second shield is positioned over each of the coupling capacitors, where each second shield is separate from the first shield and coupled to the bottom plate of each respective coupling capacitor.

19 Claims, 1 Drawing Sheet

APPARATUS AND METHOD FOR ENHANCING CAPACITANCE MATCHING IN A MULTI-STAGE WEIGHTED CAPACITOR A/D CONVERTER WITH CONDUCTIVE SHIELDS

TECHNICAL FIELD OF THE INVENTION

This invention relates in general to the field of integrated circuits. More particularly, the present invention relates to apparatus and a method for enhancing capacitance matching in a multi-stage weighted capacitor A/D converter.

BACKGROUND OF THE INVENTION

The use of a binary weighted capacitor array to perform analog to digital (A/D) and digital to analog (D/A) conversions is known in the field of integrated circuits. Prior conventional techniques for such conversions required both high performance analog and digital circuitry which cannot be economically accommodated on a single integrated circuit. The capacitor array conversion circuit is discussed in detail in "All-MOS Charge Redistribution Analog-to-Digital Conversion Techniques - Part I" published in the IEEE Journal of Solid-State Circuits, Vol. SC-10, No. 6, December 1975, and authored by J. L. McCreary and P. R. Gray. This article is incorporated herein by reference.

Thereafter, a new conversion structure evolved consisting of a two-stage weighted capacitor network 10, shown in FIG. 1. Two-stage network 10 includes a most significant bits (MSB) stage 12 and a least significant bits (LSB) stage 13. Each stage 12 and 13 includes a predetermined number of capacitors 14–18 and 20–25, respectively. Capacitors 14–18 and 20–25 are binary weighted, i.e. if the capacitances of capacitors 20, 21 and 14 are C, then the capacitances of capacitors 22 and 15 are 2C (or $2^1 * C$), the capacitances of capacitors 23 and 16 are 4C (or $2^2 * C$), the capacitances of capacitors 24 and 17 are 8C (or $2^3 * C$), and the capacitances of capacitors 25 and 18 are 16C (or $2^4 * C$). The two stages 12 and 13 are connected by a coupling capacitor 27, the value of which is equal to $$\frac{32}{31} C.$$

A comparator 28 is connected in its inverting configuration to MSB network 12. A switching matrix 29, generally consisting of switches, alternatively couples capacitors 14–18 and 20–25 to an input voltage $V_{IN}$ and reference voltages $V_{REF+}$ and $V_{REF-}$. The output 32 of comparator 28 provides the converted signal. The two-stage capacitor network is discussed in detail in "A Two-Stage Weighted Capacitor Network for D/A - A/D Conversion" published in IEEE Journal of Solid-State Circuits, Vol. SC-14, No. 4, August 1979, and authored by Y. S. Yee, L. M. Terman, and L. G. Heller, incorporated herein by reference.

The two-stage capacitor network 10 is a more desirable implementation because it requires a smaller range of capacitor values than the single array configuration and therefore requires less die area. However, the two-stage A/D converter is still plagued by a well known phenomenon, the fringing effect, which causes substantial inaccuracy in A/D converters. The fringing effect is caused by the electric field of the top plate of a capacitor in the array 14–18 and 20–25 coupling with the bottom plate of other capacitors in addition to its own bottom plate. Fringing effect may also be caused by coupling of the top plate to some other potential in the network structure. Additional contribution to the fringing effect comes from the coupling of potentials in the coupling capacitor to other potentials in the network. The end result of the fringing effect is mismatch of capacitances of the capacitors 14–18 and 20–25 and coupling capacitor 27 in the network which upsets the binary weighting requirement of the converter 10.

Known solutions to the inaccuracy induced by the fringing effect include using either a sandwich capacitor structure or adding a conductive shield. In the former method, each capacitor 14–18, 20–25 and including the coupling capacitor 27 are implemented as sandwich capacitors. Although the fringing effect is reduced significantly, additional mismatch among the capacitors is introduced by the sandwich structure. The additional mismatch is caused by the non-uniformity of the oxide layer between the metal sandwiching layer and the top plate of each capacitor. Non-uniformity of the oxide layer is common as its formation is not closely monitored.

Another possible solution to the problem is to add a conductive shield over the entire capacitor array and tie the shield to a fixed potential, such as ground. This solution overcomes the oxide non-uniformity problem associated with the sandwich capacitor solution described above, yet it introduces other factors which contribute to the inaccuracy of the converter 10. For example, parasitic capacitance is introduced between the shielding layer and the top plates of the capacitors. Therefore, the capacitance value of the coupling capacitor 27 must account for the parasitic capacitance. Computations have shown that the coupling capacitor capacitance should be equal to $32(C+C_p)/31$ for the capacitor network shown in FIG. 1, where $C_p$ is the parasitic capacitance associated with each unit capacitance C. However, because the oxide thickness between the conductive shield layer and top plates (which contributes to $C_p$) does not track the oxide thickness between the top plate and bottom plate (which contributes to C), the problem of mismatch and inaccuracy results. For additional discussions of problems associated with the capacitor network implementation, please refer to "Fully Differential ADC with Rail-to-Rail Common-Mode Range and Nonlinear Capacitor Compensation" published in IEEE Journal of Solid-State Circuits, Vol. 25, No. 1, February 1990, and authored by R. K. Hester, K. S. Tan, M. de Wit, J. W. Fattaruso, S. Kiriaki, and J. R. Hellums. This article is hereby incorporated by reference.

Therefore, a need has arisen for a solution to the fringing effect and mismatching problem in the weighted capacitor array A/D or D/A converter. The present invention provides a technique for enhancing capacitance matching among the capacitors in the array and thereby contributing to more accuracy and resolution in the A/D or D/A conversion process.

SUMMARY OF THE INVENTION

In accordance with the present invention, apparatus and a method for enhancing capacitance matching in a multi-stage weighted capacitor array are provided which substantially eliminate or reduce disadvantages and problems associated with prior circuits.

In one aspect of the present invention, apparatus for enhancing capacitance matching in a multi-stage capacitor network of an A/D converter is provided. The stages are coupled to one another by a coupling capacitor having a top and bottom plate. The apparatus comprises a first shield overlying the capacitor network excluding the coupling capacitors, where the shield is coupled to a known potential. A second shield is positioned over each of the coupling capacitors, where each second shield is separate from the first shield and coupled to the bottom plate of each respective coupling capacitor.

In another aspect of the present invention, a method for enhancing capacitance matching in a multi-stage capacitor network of an A/D converter is provided. The method comprises the steps of positioning a first shield over each stage of the capacitor network and coupling the shield to a known potential. A second shield is also formed over each of the coupling capacitors, where the second shield is separate from the first shield. The second shields are coupled to the bottom plates of the respective coupling capacitors to form a sandwich capacitor.

An important technical advantage of the present invention is decreasing the effect of capacitance mismatch due to oxide non-uniformity between the top plate and the shielding layer in the coupling capacitor and other capacitors in the network.

A further technical advantage of the present invention provides for substantially increased accuracy of the A/D or D/A converter due to the substantial elimination of the fringing effect.

BRIEF DESCRIPTION OF THE DRAWINGS

For a better understanding of the present invention, reference may be made to the accompanying drawings, in which.

DETAILED DESCRIPTION OF THE INVENTION

Figure 1:
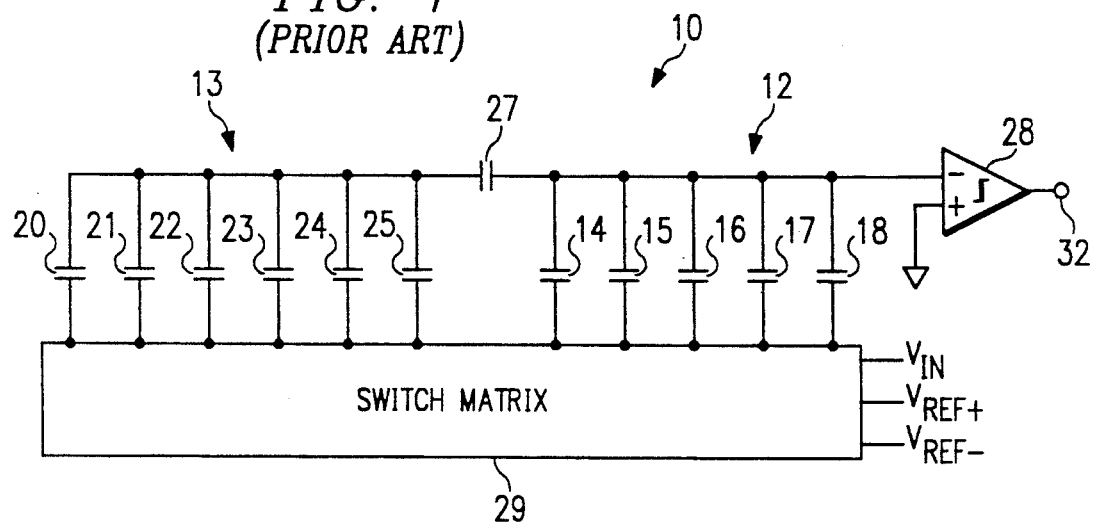
FIG. 1 is a simplified schematic of a two-stage capacitor array A/D converter.
Figure 2:
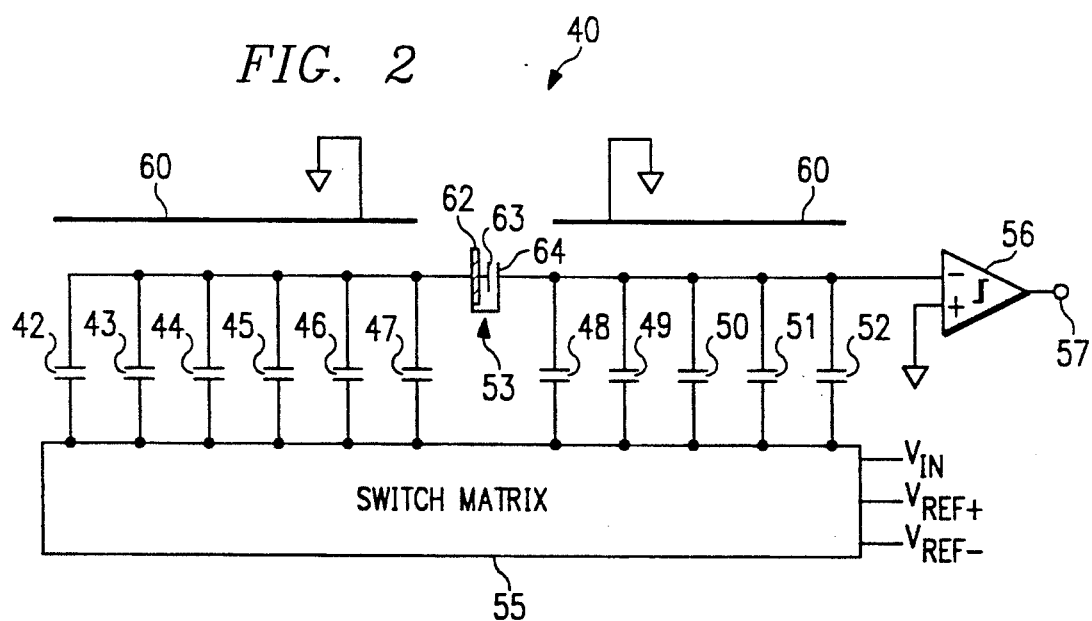
FIG. 2 is a simplified schematic of a preferred embodiment of the present invention.

With reference to the drawings, FIG. 2 illustrates the preferred embodiment of the present invention, indicated generally at 40. The basic components of the two-stage capacitor array is still present. The array includes capacitors 42-52, where capacitors 42-47 are the least significant bits (LSB) and capacitors 48-52 are the most significant bits (MSB). The LSB and MSB capacitors are connected by a coupling capacitor 53. The capacitor array is coupled to a switching matrix 55 having a known structure and function for this application. The MSB capacitor array is further coupled to one input of a comparator 56, whose output 57 provides the output of the converter 40. Comparator 56 may be implemented by an operational amplifier, where the capacitor array is coupled to the inverted input of the amplifier. Operational amplifier 56 may include feedback paths between output 57 and the inverted input as known in the art.

In the preferred embodiment of the present invention, a conductive shielding layer 60 is formed over the entire capacitor array except coupling capacitor 53. The conductive shielding layer 60 is preferably metallic and is coupled to a known or fixed potential, shown in FIG. 2 as ground. Coupling capacitor 53 is instead implemented as a sandwiched structure, where a conductive shielding layer 62 is formed over the top plate 63 and further connected to the bottom plate 64 of the coupling capacitor 53. Note that in this manner the semiconductor processing steps which form the oxide layer beneath conductive shielding layer 60 will also form the oxide layer beneath conductive sandwich layer 62 in coupling capacitor 53, so that the thickness and permittivity of the oxide layer between conductive shielding layer 60 and the top plate of capacitors 42-52 are equal to those of the oxide layer between conductive shielding layer 62 and the top plate of coupling capacitor 53. Therefore, the capacitance value of coupling capacitor 53 is given by $k(C+C_p)$, where k may be equal to 32/31. In this manner, the capacitance of coupling capacitor 53 tracks the effect of parasitic capacitance on the LSB array as the semiconductor processing varies. In the preferred embodiment of the present invention, conductive shielding layers 60 and 62 are metallic.

Furthermore, the present invention is applicable to multi-stage capacitor arrays where it is desirable to decrease the effect of capacitance mismatch and fringing. Moreover, the present invention is applicable to an implementation of a D/A converter using a capacitor network.

Although the present invention has been described in detail, it should be understood that various changes, substitutions and alterations can be made thereto without departing from the spirit and scope of the present invention as defined by the appended claims.

What is claimed is:

1. Apparatus for enhancing capacitance matching in a multi-stage capacitor network of an A/D converter, each of the stages being coupled to one another by a coupling capacitor having a top and bottom plate, the apparatus comprising:

a first shield overlying each stage of said capacitor network, said shield being coupled to a known potential; and a second shield overlying said coupling capacitor, said second shield being separate from said first shield and coupled to said bottom plate of said coupling capacitor.

2. The apparatus, as set forth in claim 1, wherein said first and second shields are metallic.

3. The apparatus, as set forth in claim 1, wherein said first shield is coupled to ground.

4. The apparatus, as set forth in claim 1, wherein said first and second shields are formed in one semiconductor processing step.

5. A method for enhancing capacitance matching in a multi-stage capacitor network of an A/D converter, two of the stages being interconnected by a coupling capacitor having a top and bottom plate, the method comprising the steps of:

positioning a first shield over said two stages of said capacitor network;

coupling said shield to a known potential;

positioning a second shield over said coupling capacitor, said second shield being separate from said first shield; and coupling said second shield to said bottom plate of said coupling capacitor.

6. The method, as set forth in claim 5, wherein said first and second shield positioning steps respectively comprise the steps of forming first and second metallic shields.

7. The method, as set forth in claim 5, wherein said first shield coupling step includes coupling said first shield to ground.

8. The method, as set forth in claim 5, wherein said first and second shield positioning steps are performed in one semiconductor processing step.

9. An integrated circuit for performing conversions between analog and digital signals, comprising:
   an input for receiving an input signal;
   an output at which a converted signal is provided;
   a capacitor network connected between said input and said output, said capacitor network having first and second stages which each include at least one capacitor, and a coupling capacitor having a top plate and a bottom plate and being connected between said first and second stages for coupling said capacitors of said first and second stages;
   a first shield overlying all of said capacitors except said coupling capacitor, said first shield being coupled to a fixed potential; and
   a second shield overlying said top plate of said coupling capacitor, said second shield being separate from said first shield and coupled to said bottom plate of said coupling capacitor.

10. The integrated circuit according to claim 9, wherein said first and second shields are metallic.

11. The integrated circuit according to claim 9, wherein said first and second shields are formed in one semiconductor processing step.

12. The integrated circuit according to claim 9 wherein said first and second stages each include a plurality of capacitors having respectively different capacitances.

13. The integrated circuit according to claim 12, wherein said integrated circuit is an A/D converter.

14. An integrated circuit for performing conversions between analog and digital signals, comprising:
   an input for receiving an input signal;
   an output at which a converted signal is provided;
   a capacitor network connected between said input and said output, said capacitor network having first and second stages which each include at least one capacitor, and a coupling capacitor having a top plate and a bottom plate and being connected between said first and second stages for coupling said capacitors of said first and second stages; and
   a first shield overlying all of said capacitors except said coupling capacitor, said first shield being coupled to electrical ground.

15. A method for realizing a multi-stage capacitor array in an integrated circuit which performs conversions between analog and digital signals, comprising the steps of:
   providing first and second capacitor stages which each include at least one capacitor;
   providing a coupling capacitor having top and bottom plates;
   connecting said coupling capacitor between said first and second stages for coupling said capacitors of said first and second stages;
   forming a first shielding layer over all of said capacitors except said coupling capacitor;
   coupling said first shielding layer to a fixed potential;
   forming over said top plate of said coupling capacitor a second shielding layer which is separate from said first shielding layer; and
   coupling said second shielding layer to said bottom plate of said coupling capacitor.

16. The method according to claim 15, wherein said steps of forming said first and second shielding layers respectively include the steps of forming first and second metallic shielding layers.

17. The method according to claim 15, wherein said steps of forming said first and second shielding layers are performed in one semiconductor processing step.

18. A method for realizing a multi-stage capacitor array in an integrated circuit which performs conversions between analog and digital signals, comprising the steps of:
   providing first and second capacitor stages which each include at least one capacitor;
   providing a coupling capacitor having top and bottom plates;
   connecting said coupling capacitor between said first and second stages for coupling said capacitors of said first and second stages;
   forming a first shielding layer over all of said capacitors except said coupling capacitor; and
   coupling said first shielding layer to electrical ground.

19. The method according to claim 18, wherein said step of providing capacitor stages includes providing in each said stage a plurality of capacitors having respectively different capacitances.

* * * * *